United States Patent
Nakatani

(10) Patent No.: US 12,080,546 B2
(45) Date of Patent: Sep. 3, 2024

(54) METHOD OF PROCESSING SUBSTRATE, METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventor: Kimihiko Nakatani, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 1016 days.

(21) Appl. No.: 17/024,012

(22) Filed: Sep. 17, 2020

(65) Prior Publication Data

US 2021/0005448 A1    Jan. 7, 2021

Related U.S. Application Data

(63) Continuation of application No. PCT/JP2019/002041, filed on Jan. 23, 2019.

(30) Foreign Application Priority Data

Apr. 27, 2018  (JP) ................. 2018-087697

(51) Int. Cl.
*H01L 21/02*   (2006.01)
*C23C 16/40*   (2006.01)
(Continued)

(52) U.S. Cl.
CPC ...... *H01L 21/02164* (2013.01); *C23C 16/401* (2013.01); *C23C 16/402* (2013.01);
(Continued)

(58) Field of Classification Search
CPC ......... H01L 21/02164; H01L 21/02208; H01L 21/02211; H01L 21/02126–0214; C23C 16/401–402; C01B 33/113–193
See application file for complete search history.

(56) References Cited

U.S. PATENT DOCUMENTS 9,312,123 B2   4/2016   Takasawa et al.
9,384,968 B2   7/2016   Takasawa et al.
(Continued)

FOREIGN PATENT DOCUMENTS

JP   2006-066587 A   3/2006
JP   2011023576 A    2/2011
(Continued)

OTHER PUBLICATIONS

PCT/JP2019/002041, International Search Report, Feb. 26, 2019, 2 pgs.

*Primary Examiner* — Jose R Diaz
(74) *Attorney, Agent, or Firm* — Volpe Koenig

(57) ABSTRACT

There is provided a technique that includes: forming a silicon oxide film having a non-stoichiometric composition on a substrate by repeating a cycle a plurality of times, the cycle including non-simultaneously performing: (a) adsorbing a pseudo catalyst on a surface of the substrate by supplying the pseudo catalyst to the substrate; (b) adsorbing silicon contained in a silicon hydride on the surface of the substrate by action of the pseudo catalyst adsorbed on the surface of the substrate by supplying the silicon hydride to the substrate; and (c) oxidizing the silicon adsorbed on the surface of the substrate by supplying an oxidizing agent to the substrate under a condition in which atomic oxygen is not generated.

18 Claims, 7 Drawing Sheets

(51) Int. Cl.
*C23C 16/455* (2006.01)
*H01L 21/67* (2006.01)

(52) U.S. Cl.
CPC .. *C23C 16/45534* (2013.01); *C23C 16/45536* (2013.01); *H01L 21/67023* (2013.01)

(56) References Cited

U.S. PATENT DOCUMENTS

| | | | |
|---|---|---|---|
| 9,384,971 B2 | 7/2016 | Takasawa et al. | |
| 9,384,972 B2 | 7/2016 | Takasawa et al. | |
| 9,385,013 B2 | 7/2016 | Takasawa et al. | |
| 9,443,719 B2 | 9/2016 | Takasawa et al. | |
| 9,443,720 B2 | 9/2016 | Takasawa et al. | |
| 9,478,417 B2 | 10/2016 | Takasawa et al. | |
| 9,487,861 B2 | 11/2016 | Takasawa et al. | |
| 9,929,005 B1 | 3/2018 | Shimamoto et al. | |
| 10,026,607 B2 | 7/2018 | Takasawa et al. | |
| 10,340,134 B2 | 7/2019 | Hirose et al. | |
| 10,720,325 B2 * | 7/2020 | Nitta | C23C 16/45527 |
| 2001/0024387 A1 | 9/2001 | Raaijmakers et al. | |
| 2001/0041250 A1 | 11/2001 | Werkhoven et al. | |
| 2002/0000644 A1 | 1/2002 | Jeon et al. | |
| 2002/0130385 A1 | 9/2002 | Jung et al. | |
| 2003/0072975 A1 | 4/2003 | Shero et al. | |
| 2005/0142716 A1 | 6/2005 | Nakajima et al. | |
| 2005/0181555 A1 | 8/2005 | Haukka et al. | |
| 2008/0268644 A1 | 10/2008 | Kameda et al. | |
| 2009/0117714 A1 | 5/2009 | Akae et al. | |
| 2010/0105192 A1 | 4/2010 | Akae et al. | |
| 2010/0130024 A1 | 5/2010 | Takasawa et al. | |
| 2011/0076857 A1 | 3/2011 | Akae et al. | |
| 2011/0124204 A1 | 5/2011 | Ota et al. | |
| 2011/0193595 A1 | 8/2011 | Fukuda et al. | |
| 2011/0230057 A1 | 9/2011 | Takasawa et al. | |
| 2011/0256733 A1 | 10/2011 | Hirose et al. | |
| 2011/0294280 A1 | 12/2011 | Takasawa et al. | |
| 2011/0318940 A1 | 12/2011 | Ota et al. | |
| 2012/0028454 A1 | 2/2012 | Swaminathan et al. | |
| 2012/0184110 A1 | 7/2012 | Hirose et al. | |
| 2012/0249217 A1 | 10/2012 | Fukuda et al. | |
| 2012/0319252 A1 | 12/2012 | Yamazaki | |
| 2013/0052836 A1 | 2/2013 | Hirose et al. | |
| 2013/0149873 A1 | 6/2013 | Hirose et al. | |
| 2013/0237064 A1 | 9/2013 | Kirikihira et al. | |
| 2013/0252435 A1 | 9/2013 | Shimamoto et al. | |
| 2013/0273748 A1 | 10/2013 | Sasajima et al. | |
| 2013/0337660 A1 | 12/2013 | Ota et al. | |
| 2014/0057452 A1 | 2/2014 | Hashimoto et al. | |
| 2014/0073142 A1 | 3/2014 | Hirose et al. | |
| 2014/0227886 A1 | 8/2014 | Sano et al. | |
| 2014/0235067 A1 | 8/2014 | Shimamoto et al. | |
| 2014/0273507 A1 | 9/2014 | Hirose et al. | |
| 2014/0287595 A1 | 9/2014 | Shimamoto et al. | |
| 2014/0287597 A1 | 9/2014 | Hirose et al. | |
| 2014/0295648 A1 | 10/2014 | Nakaiso et al. | |
| 2014/0349492 A1 | 11/2014 | Shimamoto et al. | |
| 2015/0044881 A1 | 2/2015 | Shimamoto et al. | |
| 2015/0072537 A1 | 3/2015 | Noda et al. | |
| 2015/0147891 A1 | 5/2015 | Sano et al. | |
| 2015/0171179 A1 | 6/2015 | Horii et al. | |
| 2015/0187559 A1 | 7/2015 | Sano et al. | |
| 2015/0200085 A1 | 7/2015 | Sano et al. | |
| 2015/0206736 A1 | 7/2015 | Akae et al. | |
| 2015/0214024 A1 | 7/2015 | Takasawa et al. | |
| 2015/0228474 A1 | 8/2015 | Hanashima et al. | |
| 2015/0243499 A1 | 8/2015 | Yamamoto et al. | |
| 2015/0255269 A1 | 9/2015 | Harada et al. | |
| 2015/0255274 A1 | 9/2015 | Yamamoto et al. | |
| 2015/0287588 A1 | 10/2015 | Sano et al. | |
| 2015/0357181 A1 | 12/2015 | Yamamoto et al. | |
| 2016/0013042 A1 | 1/2016 | Hashimoto et al. | |
| 2016/0024659 A1 | 1/2016 | Shimamoto et al. | |
| 2016/0064219 A1 | 3/2016 | Yamamoto et al. | |
| 2016/0071720 A1 | 3/2016 | Nitta et al. | |
| 2016/0086791 A1 | 3/2016 | Sano et al. | |
| 2016/0141173 A1 | 5/2016 | Moriya et al. | |
| 2016/0148824 A1 | 5/2016 | Takasawa et al. | |
| 2016/0211132 A1 | 7/2016 | Takasawa et al. | |
| 2016/0211133 A1 | 7/2016 | Takasawa et al. | |
| 2016/0211134 A1 | 7/2016 | Takasawa et al. | |
| 2016/0211135 A1 | 7/2016 | Noda et al. | |
| 2016/0225607 A1 | 8/2016 | Yamamoto et al. | |
| 2016/0298236 A1 | 10/2016 | Takasawa et al. | |
| 2016/0329208 A1 | 11/2016 | Takasawa et al. | |
| 2016/0358767 A1 | 12/2016 | Nitta et al. | |
| 2017/0092486 A1 | 3/2017 | Nitta et al. | |
| 2017/0170004 A1 | 6/2017 | Harada et al. | |
| 2017/0178889 A1 | 6/2017 | Yamakoshi et al. | |
| 2017/0186604 A1 | 6/2017 | Orihashi et al. | |
| 2017/0200599 A1 | 7/2017 | Takasawa et al. | |
| 2017/0221699 A1 | 8/2017 | Orihashi et al. | |
| 2017/0263439 A1 | 9/2017 | Hashimoto et al. | |
| 2017/0263441 A1 | 9/2017 | Orihashi et al. | |
| 2017/0294302 A1 | 10/2017 | Hirose et al. | |
| 2017/0294305 A1 | 10/2017 | Orihashi et al. | |
| 2017/0298508 A1 | 10/2017 | Yamakoshi et al. | |
| 2017/0345645 A1 | 11/2017 | Harada et al. | |
| 2017/0365467 A1 | 12/2017 | Shimamoto et al. | |
| 2018/0033622 A1 | 2/2018 | Swaminathan et al. | |
| 2018/0061628 A1 | 3/2018 | Ou et al. | |
| 2018/0240665 A1 | 8/2018 | Sano et al. | |
| 2018/0301347 A1 | 10/2018 | Kihara et al. | |
| 2018/0337031 A1 | 11/2018 | Hashimoto et al. | |
| 2019/0218666 A1 | 7/2019 | Harada et al. | |
| 2019/0221425 A1 | 7/2019 | Hashimoto et al. | |

FOREIGN PATENT DOCUMENTS

| | | |
|---|---|---|
| JP | 2014154809 A | 8/2014 |
| JP | 2014-192485 A | 10/2014 |

* cited by examiner

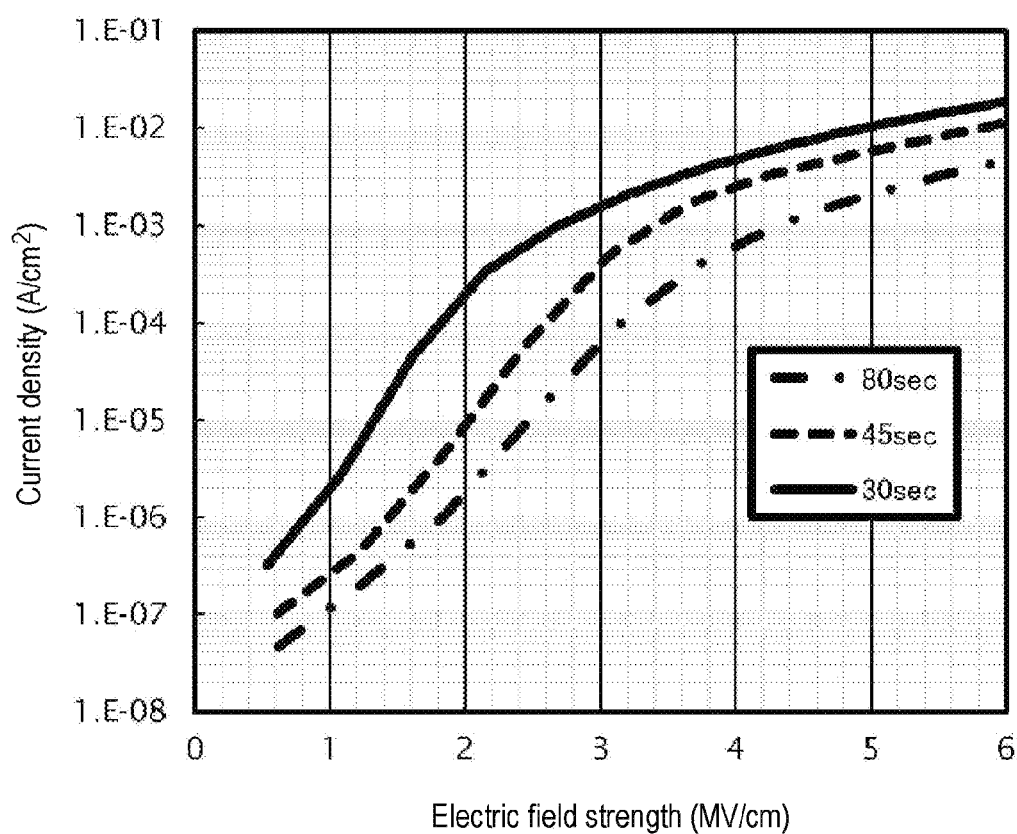

METHOD OF PROCESSING SUBSTRATE, METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is a Bypass Continuation Application of PCT International Application No. PCT/JP2019/002041, filed on Jan. 23, 2019, the entire contents of which are incorporated herein by reference.

TECHNICAL FIELD

The present disclosure relates to a method of manufacturing a semiconductor device, a substrate processing apparatus, and a recording medium.

BACKGROUND

In a related art, as an example of a process of manufacturing a semiconductor device, a process of forming a silicon oxide film on a substrate is often carried out.

SUMMARY

The present disclosure provides some embodiments of a technique capable of improving a quality of a silicon oxide film formed on a substrate.

According to one embodiment of the present disclosure, there is provided a technique that includes: forming a silicon oxide film having a non-stoichiometric composition on a substrate by repeating a cycle a plurality of times, the cycle including non-simultaneously performing: (a) adsorbing a pseudo catalyst on a surface of the substrate by supplying the pseudo catalyst to the substrate; (b) adsorbing silicon contained in a silicon hydride on the surface of the substrate by action of the pseudo catalyst adsorbed on the surface of the substrate by supplying the silicon hydride to the substrate; and (c) oxidizing the silicon adsorbed on the surface of the substrate by supplying an oxidizing agent to the substrate under a condition in which atomic oxygen is not generated.

BRIEF DESCRIPTION OF DRAWINGS

The accompanying drawings, which are incorporated in and constitute a part of the specification, illustrate embodiments of the present disclosure.

FIG. 6A is a diagram illustrating an insulation property of the SiO film.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments of the Present Disclosure

Embodiments of the present disclosure will now be described mainly with reference to FIGS. 1 to 4.

(1) Configuration of the Substrate Processing Apparatus

Figure 1:
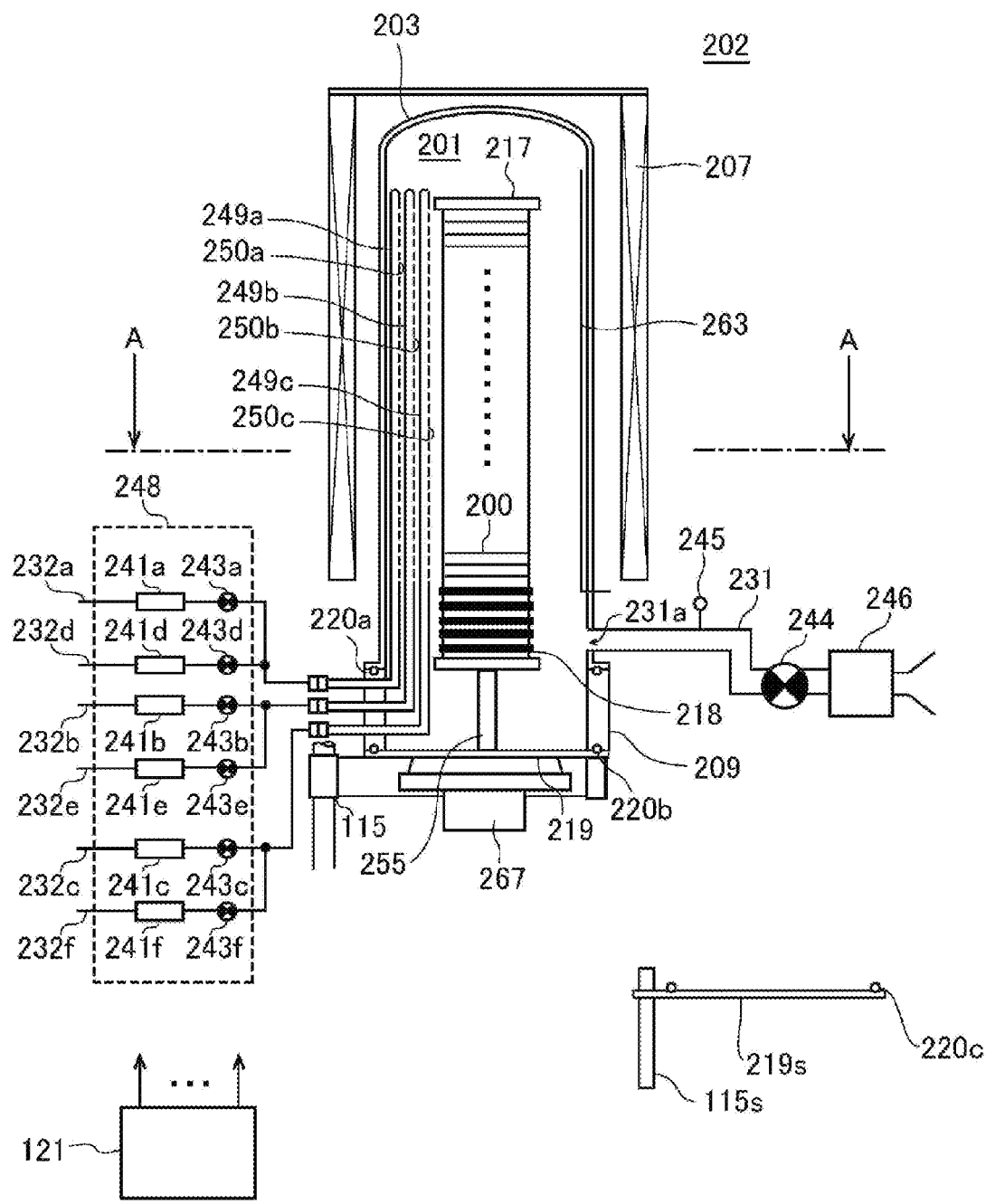
FIG. 1 is a schematic configuration diagram of a vertical type process furnace of a substrate processing apparatus suitably used in an embodiment of the present disclosure, in which a portion of the process furnace is shown in a vertical cross-sectional view.

As illustrated in FIG. 1, a process furnace 202 includes a heater 207 as a heating mechanism (temperature adjustment part). The heater 207 has a cylindrical shape and is supported by a holding plate so as to be vertically installed. The heater 207 functions as an activation mechanism (an excitation part) configured to thermally activate (excite) a gas.

A reaction tube 203 is disposed inside the heater 207 to be concentric with the heater 207. The reaction tube 203 is made of a heat resistant material, for example, quartz ($SiO_2$), silicon carbide (SiC) or the like, and has a cylindrical shape with its upper end closed and its lower end opened. A manifold 209 is disposed below the reaction tube 203 in a concentric relationship with the reaction tube 203. The manifold 209 is made of a metal material, for example, stainless steel (SUS), and has a cylindrical shape with its upper and lower ends opened. The upper end of the manifold 209 engages with the lower end of the reaction tube 203. The manifold 209 is configured to support the reaction tube 203. An O-ring 220a as a seal member is installed between the manifold 209 and the reaction tube 203. Similar to the heater 207, the reaction tube 203 is vertically installed. A processing vessel (reaction vessel) is mainly configured by the reaction tube 203 and the manifold 209. A process chamber 201 is formed in a hollow cylindrical portion of the processing vessel. The process chamber 201 is configured to be capable of accommodating wafers 200 as substrates. The processing of the wafers 200 is performed in the process chamber 201.

Nozzles 249a to 249c as first to third supply parts are installed in the process chamber 201 so as to penetrate a sidewall of the manifold 209. Gas supply pipes 232a to 232c are respectively connected to the nozzles 249a to 249c. The nozzles 249a to 249c are different nozzles, in which each of the nozzles 249a and 249c is installed adjacent to the nozzle 249b.

Mass flow controllers (MFCs) 241a to 241c, which are flow rate controllers (flow rate control parts), and valves 243a to 243c, which are opening/closing valves, are installed in this order at the gas supply pipes 232a to 232c from the corresponding upstream sides of gas flow, respectively. Gas supply pipes 232d to 232f are respectively connected to the gas supply pipes 232a to 232c at the downstream side of the valves 243a to 243c. MFCs 241d to 241f and valves 243d to 243f are respectively installed in this order at the gas supply pipes 232d to 232f from the corresponding upstream sides of gas flow.

Figure 2:
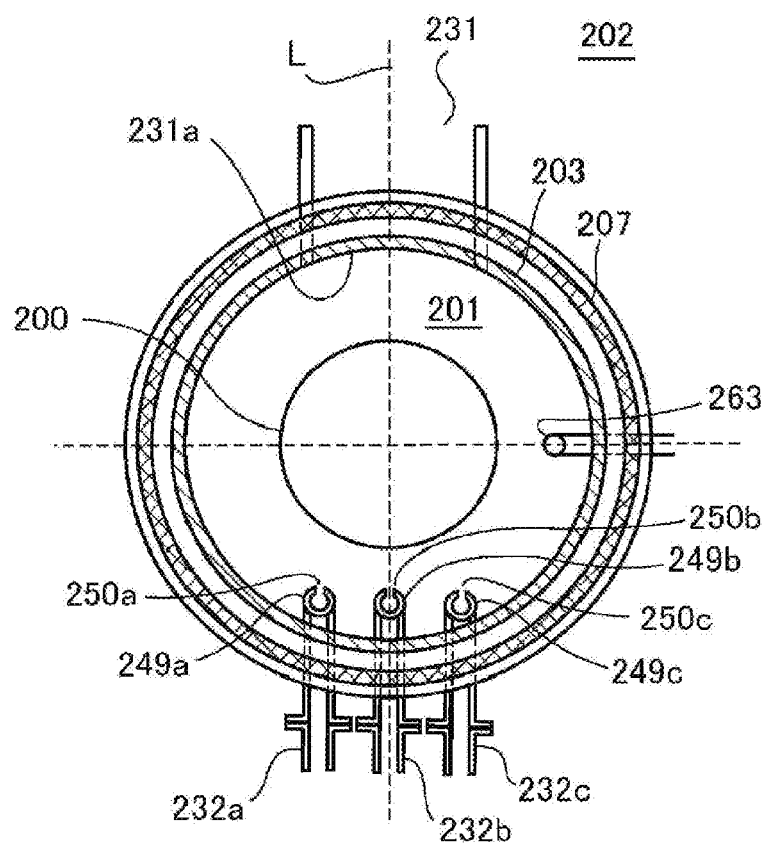
FIG. 2 is a schematic configuration diagram of a portion of the vertical type process furnace of the substrate processing apparatus suitably used in the embodiment of the present disclosure, in which the portion of the process furnace is shown in a cross-sectional view taken along line A-A in FIG. 1.

As illustrated in FIG. 2, the nozzles 249a to 249c are installed in a space with an annular shape, when seen in a plan view, between an inner wall of the reaction tube 203 and the wafers 200 such that the nozzles 249a to 249c extend upward along an arrangement direction of the wafers 200 from a lower portion of the inner wall of the reaction tube 203 to an upper portion of the inner wall of the reaction tube 203. Specifically, the nozzles 249a to 249c are installed at a lateral side of a wafer arrangement region in which the wafers 200 are arranged, namely in a region which horizontally surrounds the wafer arrangement region, so as to extend along the wafer arrangement region. The nozzle 249b is disposed to face an exhaust port 231a, which will be described later, on a straight line in the plan view, with centers of the wafers 200 loaded into the process chamber 201 interposed therebetween. The nozzles 249a and 249c are disposed to sandwich a straight line L passing through the nozzle 249b and a center of the exhaust port 231a from both sides along the inner wall of the reaction tube 203 (an outer peripheral portion of the wafers 200). Gas supply holes 250a to 250c configured to supply a gas are installed on the side surfaces of the nozzles 249a to 249c, respectively. The gas supply holes 250a to 250c are opened to face the exhaust port 231a in the plan view, thus allowing a gas to be supplied toward the wafers 200. The gas supply holes 250a to 250c may be formed in a plural number between the lower portion of the reaction tube 203 and the upper portion of the reaction tube 203.

A boron halide gas, which contains boron (B) and halogen, as a pseudo catalyst, is supplied from the gas supply pipe 232a into the process chamber 201 via the MFC 241a, the valve 243a, and the nozzle 249a. As the boron halide gas, it may be possible to use, for example, a boron chloride gas containing B and chlorine (Cl). As the boron chloride gas, it may be possible to use, for example, a trichloroborane ($BCl_3$) gas. Furthermore, the term "catalyst" refers to a substance which does not change itself before and after a chemical reaction but changes a reaction rate. The $BCl_3$ gas in a reaction system of the present embodiment has a catalytic action that changes the reaction rate or the like, but may change itself before and after the chemical reaction. For example, the $BCl_3$ gas itself may change before and after the chemical reaction by partial decomposition of its molecular structure when it reacts with a $Si_2H_6$ gas. That is, the $BCl_3$ gas in the reaction system of the present embodiment acts as a catalyst but is not a "catalyst" in a strict sense. Thus, a substance, which acts like a "catalyst" but changes itself before and after the chemical reaction, will be referred to herein as a "pseudo catalyst." In the present disclosure, $BCl_3$ acting as the pseudo catalyst and a substance obtained by decomposing a portion of $BCl_3$ acting as the pseudo catalyst will be generally referred to as $BCl_x$ (where x is 1 to 3).

A silicon hydride gas, which consists of two elements of silicon (Si) as a main element (predetermined element) constituting a film to be formed on a wafer 200, and hydrogen (H), as a precursor, is supplied from the gas supply pipe 232b into the process chamber 201 via the MFC 241b, the valve 243b, and the nozzle 249b. The silicon hydride gas is a gas which does not contain carbon (C) and nitrogen (N) and does not contain halogen such as Cl, fluorine (F) or the like. As the silicon hydride gas, it may be possible to use, for example, a disilane ($Si_2H_6$, abbreviation: DS) gas.

An oxygen (O)-containing gas as an oxidizing agent is supplied from the gas supply pipe 232c into the process chamber 201 via the MFC 241c, the valve 243c, and the nozzle 249c. As the O-containing gas, it may be possible to use, for example, an oxygen ($O_2$) gas.

An inert gas, for example, a nitrogen ($N_2$) gas, is supplied from the gas supply pipes 232d to 232f into the process chamber 201 via the MFCs 241d to 241f, the valves 243d to 24f, the gas supply pipes 232a to 232c, and the nozzles 249a to 249c. The $N_2$ gas acts as a purge gas, a carrier gas, a dilution gas, or the like.

A pseudo catalyst supply system mainly includes the gas supply pipe 232a, the MFC 241a, and the valve 243a. A silicon hydride supply system mainly includes the gas supply pipe 232b, the MFC 241b, and the valve 243b. An oxidizing agent supply system mainly includes the gas supply pipe 232c, the MFC 241c, and the valve 243c. An inert gas supply system mainly includes the gas supply pipes 232d to 232f, the MFCs 241d to 241f, and the valves 243d to 243f.

One or all of various supply systems described above may be configured as an integrated supply system 248 in which the valves 243a to 243f, the MFCs 241a to 241f, and the like are integrated. The integrated supply system 248 is connected to each of the gas supply pipes 232a to 243f so that a supply operation of various kinds of gases into the gas supply pipes 232a to 232f, that is, an opening/closing operation of the valves 243a to 243f, a flow rate adjusting operation by the MFCs 241a to 241f or the like, is controlled by a controller 121 which will be described later. The integrated supply system 248 is configured as an integral type or division type integrated unit, and is also configured so that it is attached to or detachable from the gas supply pipes 232a to 232f or the like, so as to perform maintenance, replacement, expansion or the like of the integrated supply system 248, on an integrated unit basis.

The exhaust port 231a configured to exhaust an internal atmosphere of the process chamber 201 is installed at a lower side of the sidewall of the reaction tube 203. As illustrated in FIG. 2, the exhaust port 231a is installed at a position facing the nozzles 249a to 249c (the gas supply holes 250a to 250c) in plan view, with the wafers 200 interposed therebetween. The exhaust port 231a may be installed between the lower portion of the sidewall of the reaction tube 203 and the upper portion of the sidewall of the reaction tube 203, that is, along the wafer arrangement region. An exhaust pipe 231 is connected to the exhaust port 231a. A vacuum pump 246 as a vacuum exhaust device is connected to the exhaust pipe 231 via a pressure sensor 245 as a pressure detector (pressure detection part) which detects the internal pressure of the process chamber 201 and an auto pressure controller (APC) valve 244 as a pressure regulator (pressure regulation part). The APC valve 244 is configured so that a vacuum exhaust and a vacuum exhaust stop of the interior of the process chamber 201 can be performed by opening and closing the APC valve 244 while operating the vacuum pump 246 and so that the internal pressure of the process chamber 201 can be adjusted by adjusting an opening degree of the APC valve 244 based on pressure information detected by the pressure sensor 245 while operating the vacuum pump 246. An exhaust system mainly includes the exhaust pipe 231, the APC valve 244 and the pressure sensor 245. The vacuum pump 246 may be regarded as being included in the exhaust system.

A seal cap 219, which serves as a furnace opening cover configured to be capable of hermetically sealing a lower end opening of the manifold 209, is installed under the manifold 209. The seal cap 219 is made of a metal material such as stainless steel (SUS) or the like, and is formed in a disc shape. An O-ring 220b, which is a seal member making contact with the lower end portion of the manifold 209, is installed at an upper surface of the seal cap 219. A rotation mechanism 267 configured to rotate a boat 217, which will be described later, is installed under the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up or down by a boat elevator 115 which is an elevator mechanism installed outside the reaction tube 203. The boat elevator 215 is configured as a transfer device (transfer mechanism) which loads or unloads (transfers) the wafers 200 into or from (out of) the process chamber 201 by moving the seal cap 219 up or down. A shutter 219s as a furnace opening cover capable of hermetically sealing the lower end opening of the manifold 209, with the boat 217 unloaded from the interior of the process chamber 201 by moving the seal cap 219 down, is installed under the manifold 209. The shutter 219s is made of a metal material such as stainless steel or the like, and is formed in a disc shape. An O-ring 220c as a seal member making contact with the lower end portion of the manifold 209 is installed on an upper surface of the shutter 219s. An opening/closing operation (an up-down movement operation or a rotational movement operation) of the shutter 219s is controlled by a shutter opening/closing mechanism 115s.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed below the boat 217 in multiple stages.

A temperature sensor 263 serving as a temperature detector is installed in the reaction tube 203. Based on temperature information detected by the temperature sensor 263, a degree of supplying electric power to the heater 207 is adjusted such that the interior of the process chamber 201 has a desired temperature distribution. The temperature sensor 263 is installed along the inner wall of the reaction tube 203.

Figure 3:
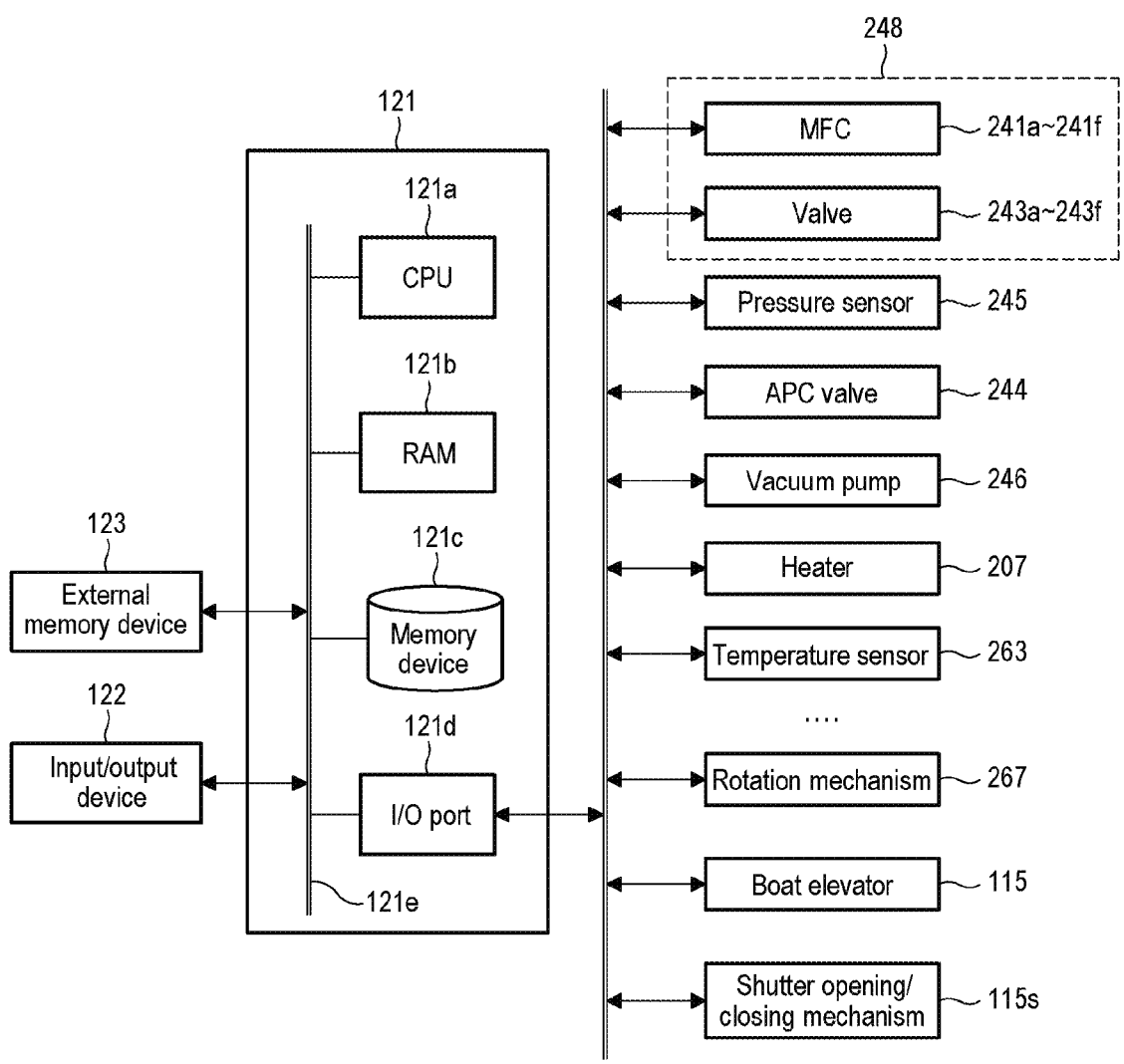
FIG. 3 is a schematic configuration diagram of a controller of the substrate processing apparatus suitably used in an embodiment of the present disclosure, in which a control system of the controller is shown in a block diagram.

As illustrated in FIG. 3, the controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to be capable of exchanging data with the CPU 121a via an internal bus 121e. An input/output device 122 formed of for example, a touch panel or the like, is connected to the controller 121.

The memory device 121c includes, for example, a flash memory, a hard disk drive (HDD), or the like. A control program that controls operations of a substrate processing apparatus, a process recipe that specifies sequences and conditions of substrate processing as described hereinbelow, or the like is readably stored in the memory device 121c. The process recipe functions as a program configured to cause the controller 121 to execute each sequence in the substrate processing, as described hereinbelow, to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 121b is configured as a memory area (work area) in which a program, data and the like read by the CPU 121a is temporarily stored.

The I/O port 121d is connected to the MFCs 241a to 241f, the valves 243a to 243f, the pressure sensor 245, the APC valve 244, the vacuum pump 246, the temperature sensor 263, the heater 207, the rotation mechanism 267, the boat elevator 115, the shutter opening/closing mechanism 115s, and the like, as described above.

The CPU 121a is configured to read the control program from the memory device 121c and execute the same. The CPU 121a also reads the recipe from the memory device 121c according to an input of an operation command from the input/output device 122. In addition, the CPU 121a is configured to control, according to the contents of the recipe thus read, the flow rate adjusting operation of various kinds of gases by the MFCs 241a to 241f, the opening/closing operation of the valves 243a to 243f, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up or down with the boat elevator 115, the operation of opening and closing the shutter 219s with the shutter opening/closing mechanism 115s, and the like.

The controller 121 may be configured by installing, on the computer, the aforementioned program stored in an external memory device 123. The external memory device 123 may include, for example, a magnetic disc such as an HDD, an optical disc such as a CD, a magneto-optical disc such as a MO, a semiconductor memory such as a USB memory, and the like. The memory device 121c or the external memory device 123 is configured as a computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer by using a communication means such as the Internet or a dedicated line, instead of using the external memory device 123.

(2) Substrate Processing

A substrate processing sequence example of forming a film on a wafer 200 as a substrate by using the aforementioned substrate processing apparatus, that is, a film-forming sequence example, which is one of the processes for manufacturing a semiconductor device, will be described with reference to FIG. 4. In the following descriptions, operations of the respective parts constituting the substrate processing apparatus are controlled by the controller 121.

Figure 4:
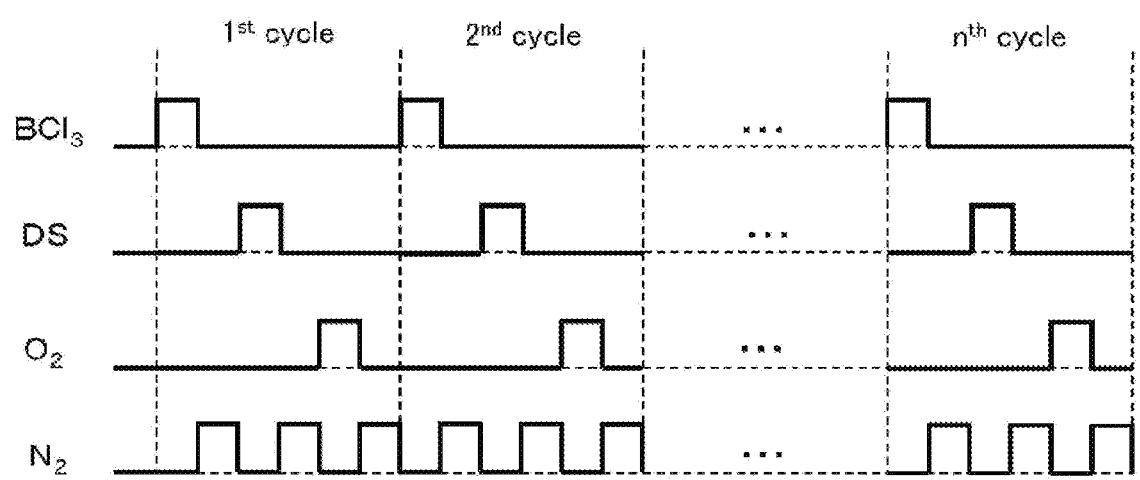
FIG. 4 is a diagram illustrating a film-forming sequence according to an embodiment of the present disclosure.

In the film-forming sequence illustrated in FIG. 4, a silicon oxide film (SiO film) having a non-stoichiometric composition as a film containing Si and O is formed on a wafer 200 by repeating a cycle a plurality of times, the cycle including non-simultaneously performing: (a) a step of adsorbing a $BCl_3$ gas on a surface of the wafer 200 by supplying the $BCl_3$ gas as a pseudo catalyst to the wafer 200 (step 1); (b) a step of adsorbing Si contained in a DS gas on the surface of the wafer 200 by action of the pseudo catalyst, that is, $BCl_x$ adsorbed on the surface of the wafer 200, by supplying the DS gas as silicon hydride to the wafer 200 (step 2); and (c) a step of oxidizing Si adsorbed on the surface of the wafer 200 by supplying an $O_2$ gas as an oxidizing agent to the wafer 200 under a condition in which atomic oxygen is not generated (step 3).

Furthermore, at each of steps (a) to (c), each processing is performed by supplying each gas to the wafer 200 in a non-plasma atmosphere without being plasma-excited.

In the present disclosure, for the sake of convenience, the film-forming sequence illustrated in FIG. 4 may sometimes be denoted as follows.

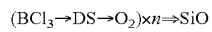

$(BCl_3 \rightarrow DS \rightarrow O_2) \times n \Rightarrow SiO$

When the term "wafer" is used herein, it may refer to a wafer itself or a laminated body of a wafer and a predetermined layer or film formed on the surface of the wafer. In addition, when the phrase "a surface of a wafer" is used herein, it may refer to a surface of a wafer itself or a surface of a predetermined layer or the like formed on a wafer. Furthermore, in the present disclosure, the expression "a predetermined layer is formed on a wafer" may mean that a predetermined layer is directly formed on a surface of a wafer itself or that a predetermined layer is formed on a layer or the like formed on a wafer. In addition, when the term "substrate" is used herein, it may be synonymous with the term "wafer."

(Wafer Charging and Boat Loading)

If a plurality of wafers 200 is charged on the boat 217 (wafer charging), the shutter 219s may be moved by the shutter opening/closing mechanism 115s to open the lower end opening of the manifold 209 (shutter opening). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 via the O-ring 220b. The wafers 200 are provided in the process chamber 201 by these operations.

(Pressure Regulation and Temperature Adjustment)

After the wafers 200 are provided in the process chamber 201 as described above, the interior of the process chamber 201, namely the space in which the wafers 200 are located, is vacuum-exhausted (depressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information (pressure regulation). Furthermore, the wafers 200 in the process chamber 201 are heated by the heater 207 to a desired film-forming temperature. In this operation, the degree of supplying electric power to the heater 207 is feedback-controlled based on the temperature information detected by the temperature sensor 263 such that the interior of the process chamber 201 has a desired temperature distribution. In addition, the rotation of the wafers 200 by the rotation mechanism 267 begins. The exhaust of the interior of the process chamber 201 and the heating and rotation of the wafers 200 may be all continuously performed at least until the processing of the wafers 200 is completed.

(Film-Forming Step)

Next, the following steps 1 to 3 are sequentially performed.

[Step 1]

At this step, a $BCl_3$ gas is supplied to the wafer 200 in the process chamber 201. Specifically, the valve 243a is opened to allow a $BCl_3$ gas to flow through the gas supply pipe 232a. The flow rate of the $BCl_3$ gas is adjusted by the MFC 241a. The $BCl_3$ gas is supplied into the process chamber 201 via the nozzle 249a and is exhausted from the exhaust port 231a. At this time, the $BCl_3$ gas is supplied to the wafer 200. Simultaneously, the valves 243d to 243f may be opened to allow a $N_2$ gas to flow through the gas supply pipes 232d to 232f.

The processing conditions at this step may be exemplified as follows:
 $BCl_3$ gas supply flow rate: 50 to 1,000 sccm
 $N_2$ gas supply flow rate (per gas supply pipe): 0 to 10,000 sccm
 Supply time of each gas: 1 to 100 seconds
 Processing temperature: 350 to 550 degrees C., specifically 350 to 500 degrees C. in some embodiments
 Processing pressure: 1 to 933 Pa.

Furthermore, in the present disclosure, the expression of the numerical range such as "350 to 550 degrees C." may mean that a lower limit value and an upper limit value are included in that range. Therefore, "350 to 550 degrees C." may mean "350 degrees C. or higher and 550 degrees C. or lower". The same applies to other numerical ranges.

By supplying the $BCl_3$ gas to the wafer 200 under the aforementioned conditions, $BCl_3$ can be adsorbed on the outermost surface of the wafer 200 while suppressing the decomposition of the $BCl_3$ gas in the process chamber 201 in the gas phase (gas-phase decomposition), that is, pyrolysis. Thus, a layer containing B and Cl is formed on the wafer 200 as a first layer (initial layer). The first layer becomes a layer containing $BCl_x$ acting as a pseudo catalyst. The first layer may also be referred to as a pseudo catalyst layer. The surface of the wafer 200, that is, the surface of the first layer formed on the wafer 200, is terminated with Cl.

After the first layer is formed on the wafer 200, the valve 243a is closed to stop the supply of the $BCl_3$ gas into the process chamber 201. Then, the interior of the process chamber 201 is vacuum-exhausted and the gas or the like remaining within the process chamber 201 is removed from the interior of the process chamber 201. At this time, the valves 243d to 243f are opened to supply a $N_2$ gas into the process chamber 20. The $N_2$ gas acts as a purge gas. These make it possible to remove the $BCl_3$ gas floating in the process chamber 201. Also, this makes it possible to perform step 2 as described hereinbelow in a state where the $BCl_3$ gas is not floating in the process chamber 201 (non-floating state).

As the pseudo catalyst, it may be possible to use, in addition to the $BCl_3$ gas, a boron chloride gas such as a monochloroborane ($BClH_2$) gas or a dichloroborane ($BCl_2H$) gas, a boron bromide gas such as a tribromoborane ($BBr_3$) gas, or a boron fluoride gas such as a trifluoroborane ($BF_3$) gas.

As the inert gas, it may be possible to use, in addition to the $N_2$ gas, a rare gas such as a Ar gas, a He gas, a Ne gas, a Xe gas or the like. This also applies to steps 2 and 3, a post-treatment step, and the like, as described hereinbelow.

[Step 2]

At this step, a DS gas is supplied to the wafer 200 in the process chamber 201, namely the first layer formed on the wafer 200, in a state where the $BCl_3$ gas is not floating in the process chamber 201. Specifically, the opening/closing control of the valves 243b and 243d to 243f is performed in the same procedure as the opening/closing control of the valves 243a and 243d to 243f at step 1. The flow rate of the DS gas is controlled by the WC 241b. The DS gas is supplied into the process chamber 201 via the nozzle 249b and is exhausted from the exhaust port 231a. At this time, the DS gas is supplied to the wafer 200.

The processing conditions at this step may be exemplified as follows:
DS gas supply flow rate: 1 to 1,000 sccm, specifically 1 to 500 sccm in some embodiments
Supply time of DS gas: 1 to 60 seconds
Processing pressure: 1 to 533 Pa.

Other processing conditions may be similar to the processing conditions of step 1.

By supplying the DS gas to the wafer 200 under the aforementioned conditions, a catalytic reaction can occur by the catalytic action of $BCl_x$ contained in the first layer to decompose at least a portion of the molecular structure of DS. Then, Si contained in an intermediate generated by the decomposition of DS can be adsorbed on the surface of the wafer 200. Thus, a silicon layer (Si layer) which is a layer containing Si can be formed on the wafer 200 as a second layer by using the first layer as a pseudo catalyst. Since the DS gas is terminated with a Si—H bond, it has characteristics that are difficult to be adsorbed on the surface of the wafer 200, but is efficiently adsorbed on the surface of the wafer 200 by utilizing the catalytic action of $BCl_x$. As described above, the formation reaction of the second layer goes ahead by the catalytic action of $BCl_x$, which has been adsorbed on the surface of the wafer 200 in advance, and thus is mainly the surface reaction, rather than the gas-phase reaction. At this time, since $BCl_3$ is not floating in the process chamber 201, the formation reaction of the second layer can more reliably go ahead by the surface reaction, rather than by the gas-phase reaction.

After the second layer is formed on the wafer 200, the valve 243b is closed to stop the supply of the DS gas into the process chamber 201. Then, the gas or the like remaining within the process chamber 201 is removed from the interior of the process chamber 201 by the same processing procedure as that of step 1.

As the precursor, it may be possible to use, in addition to the DS gas, a silicon hydride gas such as a monosilane ($SiH_4$, abbreviation: MS) gas, a trisilane ($Si_3Hg$) gas, a tetrasilane ($Si_4H_{10}$) gas, a pentasilane ($Si_5H_{12}$) gas, a hexasilane ($Si_6H_{14}$) gas or the like.

[Step 3]

At this step, an $O_2$ gas is supplied to the wafer 200 in the process chamber 201, namely the second layer formed on the wafer 200, under a condition in which atomic oxygen is not generated. That is, the $O_2$ gas is supplied to the wafer 200 in a non-plasma atmosphere without being plasma-excited. Specifically, the opening/closing control of the valves 243c, and 243d to 243f is performed in the same procedure as the opening/closing control of the valves 243a, and 243d to 243f at step 1. The flow rate of the $O_2$ gas is controlled by the MFC 241c. The $O_2$ gas is supplied into the process chamber 201 via the nozzle 249c and is exhausted from the exhaust port 231a. At this time, the $O_2$ gas in a plasma non-excited state (a thermally excited state) is supplied to the wafer 200.

The processing conditions at this step may be exemplified as follows:
$O_2$ gas supply flow rate: 1 to 10,000 sccm
Supply time of $O_2$ gas: 1 to 120 seconds
Processing pressure: 1 to 4,000 Pa, specifically 1 to 3,000 Pa in some embodiments.

Other processing conditions may be similar to the processing conditions of step 1.

By supplying the $O_2$ gas to the wafer 200 under the aforementioned conditions, that is, under the condition in which atomic oxygen is not generated, at least a portion of the second layer formed on the wafer 200, that is, at least a portion of Si adsorbed on the surface of the wafer 200, can be oxidized (modified). Thus, an impurity such as H, B, Cl or the like can be desorbed from the second layer and an O component contained in the $O_2$ gas can be introduced into the second layer. By oxidizing the second layer, a silicon oxide layer (SiO layer) which is a layer containing Si and O can be formed on the wafer 200 as a third layer.

After the third layer is formed on the wafer 200, the valve 243c is closed to stop the supply of the $O_2$ gas into the process chamber 201. Then, the gas or the like remaining within the process chamber 201 is removed from the interior of process chamber 201 by the same processing procedure as that of step 1.

As the oxidizing agent, it may be possible to use, in addition to the $O_2$ gas, an O-containing gas such as a nitrous oxide ($N_2O$) gas, a nitrogen monoxide (NO) gas, a nitrogen dioxide ($NO_2$) gas, a carbon monoxide (CO) gas, a carbon dioxide ($CO_2$) gas or the like. By supplying these oxidizing agents to the wafer 200 under the same conditions as those described above, the supply of the oxidizing agents to the wafer 200 under the condition in which atomic oxygen is not generated is possible. By using these O-containing gases having a relatively weak oxidizing power as the oxidizing agent, it becomes easy to allow the oxidation reaction of the second layer to go ahead in an unsaturated reaction, as will be described later. Thus, it is possible to allow the SiO film formed on the wafer 200 to become a film having a non-stoichiometric composition, that is, a Si-rich SiO film. However, in order to prevent C and N from being mixed into the SiO film formed on the wafer 200, the $O_2$ gas may be used as the oxidizing agent.

[Performing a Predetermined Number of Times]

A cycle which non-simultaneously, that is, non-synchronously, performs steps 1 o 3 described above is implemented a predetermined number of times (n times, where n is an integer of 1 or more), whereby a SiO film having a predetermined composition and a predetermined thickness can be formed on the wafer 200. The aforementioned cycle may be repeated multiple times. That is, the thickness of the third layer formed per the aforementioned cycle may be set smaller than a desired thickness and the cycle may be repeated multiple times until the thickness of the SiO film formed by laminating the third layer becomes equal to the desired thickness.

Furthermore, at the film-forming step, when the $BCl_3$ gas alone exists in the process chamber 201 at all steps 1 to 3, a condition in which the $BCl_3$ gas is not pyrolyzed (gas-phase decomposed) but adsorbed on the surface of the wafer 20 in the form of $BCl_x$ may be adopted at step 1. By performing the film-forming step under such a condition, it is possible to contain $BCl_x$ acting as a pseudo catalyst in the first layer formed on the wafer 200. Furthermore, it is possible to enhance thickness uniformity of the first layer formed on the wafer 200 in the plane of the wafer (hereinafter, also simply referred to as in-plane thickness uniformity), and to improve step coverage characteristics. As a result, it is possible to allow the formation reaction of the second layer to go ahead efficiently and at a uniform rate over the entire in-plane region of the wafer 200. Moreover, it is possible to increase the formation rate of the SiO film formed on the wafer 200, and to allow this film to become a film having high film thickness uniformity in the plane of the wafer (hereinafter, also simply referred to as "in-plane film thickness uniformity") and excellent step coverage characteristics.

In addition, at the-film forming step, it is desirable that step 2 be performed under a condition in which a film formation reaction does not go ahead when the DS gas alone exists in the process chamber 201. Even when such a condition is adopted, the film-forming process can go ahead at a practical rate by utilizing the catalytic action of $BCl_x$ contained in the first layer. Furthermore, at step 2, in the case where the condition in which the film-forming reaction does not go ahead when the DS gas alone exists in the process chamber 201 is adopted, it is possible to appropriately suppress the pyrolysis (gas-phase decomposition) of the DS gas in the process chamber 201. As a result, it is ensured that the SiO film formed on the wafer 200 becomes a film having high in-plane film thickness uniformity and excellent step coverage.

Moreover, at the film-forming step, the condition in which atomic oxygen (O) is not generated in the process chamber 201 may be adopted at step 3. That is, the condition in which the state where atomic oxygen does not exist in the process chamber 201 when supplying the $O_2$ gas at step 3 can be maintained may be adopted. For example, such a condition can be maintained by thermally exciting the $O_2$ gas, instead of plasma-exciting it, and supplying the $O_2$ gas to the wafer 200 in a non-plasma atmosphere. By performing the film-forming step under such conditions, it is possible to allow the oxidation reaction of the second layer to go ahead in an unsaturated reaction (unsaturated oxidation). As a result, the SiO film formed on the wafer 200 can become a film having a non-stoichiometric composition, that is, a Si-rich SiO film. The ratio of the number of Si atoms to the number of O atoms in the SiO film formed in the present embodiment becomes larger than the ratio of the number of Si atoms to the number of O atoms in the $SiO_2$ film having a stoichiometric composition. By forming the SiO film from such a substance having a Si-rich composition, it is possible to allow this film to become a film having excellent processing resistance.

However, if the composition of the SiO film becomes excessively Si-rich, an insulation property of this film may be deteriorated.

Therefore, at the film forming step, the supply time of the $O_2$ gas at step 3 may be set longer than the supply time of the DS gas at step 2. By adopting such conditions, it becomes possible to allow the oxidation reaction of the second layer to appropriately go ahead and to avoid the composition of the SiO film formed on the wafer 200 from becoming excessively Si-rich. In addition, at the film-forming step, the supply time of the $O_2$ gas at step 3 may be set longer than the supply time of the $BCl_3$ gas at step 1, and the supply time of the $BCl_3$ gas at step 1 may be set longer than the supply time of the DS gas at step 2. By adopting such conditions, it becomes possible to further avoid the composition of the SiO film formed on the wafer 200 from becoming excessively Si-rich. Furthermore, by setting the supply time of the $O_2$ gas at step 3 to 10 times or more the supply time of the DS gas at step 2, it is possible to reliably avoid the composition of the SiO film formed on the wafer 200 from becoming excessively Si-rich.

In addition, at the film-forming step, the internal pressure of the process chamber 201 at step 3 may be set higher than the internal pressure of the process chamber 201 at step 2. By adopting such conditions, it becomes possible to allow the oxidation reaction of the second layer to appropriately go ahead and to avoid the composition of the SiO film formed on the wafer 200 from becoming excessively Si-rich. Furthermore, at the film-forming step, the internal pressure of the process chamber 201 at step 3 may be set higher than the internal pressure of the process chamber 201 at step 1, and the internal pressure of the process chamber 201 at step 1 may be set higher than the internal pressure of the process chamber 201 at step 2. By adopting such conditions, it becomes possible to further avoid the composition of the SiO film formed on the wafer 200 from becoming excessively Si-rich. In addition, by setting the internal pressure of the process chamber 201 at step 3 to 14 times or more the internal pressure of the process chamber 201 at step 2, it is possible to reliably avoid the composition of the SiO film formed on the wafer 200 from becoming excessively Si-rich.

According to the present embodiment, the SiO film formed on the wafer 200 can be formed of a substance represented by a chemical formula SiO (where $1.5 \leq x \leq 1.9$), specifically a substance represented by a chemical formula SiO (where $1.6 \leq x \leq 1.8$) in some embodiments. Furthermore, if x exceeds 1.9 in the chemical formula described above, there may be a case where the aforementioned effect of improving the processing resistance of the SiO film formed on the wafer 200 is not achieved. By setting x to 1.9 or less, it is possible to improve the processing resistance of the SiO film formed on the wafer 200, and by setting x to 1.8 or less, it is possible to reliably improve the processing resistance of the SiO film formed on the wafer 200. Furthermore, if x is less than 1.5 in the chemical formula described above, there may be a case where the insulation property of the SiO film formed on the wafer 200 is deteriorated. By setting x to 1.5 or more, it is possible to avoid the deterioration of the insulation property of the SiO film formed on the wafer 200, and by setting x to 1.6 or more, it is possible to reliably avoid the deterioration of the insulation property of the SiO film formed on the wafer 200. That is, according to the present embodiment, it is possible to allow the SiO film formed on the wafer 200 to become a film having excellent processing resistance and excellent insulation property. This film becomes a film having both advantages of a silicon film (Si film) not containing 0 and advantages of a $SiO_2$ film having a stoichiometric composition.

(Post-Treatment Step)

After the formation of the SiO film on the wafer 200 is completed, the temperature of the heater 207 is adjusted appropriately such that the SiO film formed on the wafer 200 is heat-treated (annealed) as a post-treatment. This step may be performed while opening the valves 243d to 243f to supply a $N_2$ gas into the process chamber 201 or while closing the valves 243d to 243f to stop the supply of the $N_2$ gas into the process chamber 201. In either case, this step is performed while closing the valves 243a to 243c to stop the supply of each of the pseudo catalyst, the silicon hydride, and the oxidizing agent into the process chamber 201.

The processing conditions at this step may be exemplified as follows:

N$_2$ gas supply flow rate (per gas supply pipe): 0 to 20,000 sccm
Processing temperature: 600 to 1,000 degrees C.
Processing pressure: 0.1 to 100,0000 Pa
Processing time: 1 to 300 minutes.

(After-Purge and Atmospheric Pressure Return)

After the film-forming step and the post-treatment step are completed, the N$_2$ gas as a purge gas is supplied from each of the nozzles 249a to 249c into the process chamber 201 and is exhausted from the exhaust port 231a. Thus, the interior of the process chamber 201 is purged and the gas or the reaction byproduct, which remains within the process chamber 201, is removed from the interior of the process chamber 201 (after-purge). Thereafter, the internal atmosphere of the process chamber 201 is substituted by an inert gas (inert gas substitution). The internal pressure of the process chamber 201 is returned to an atmospheric pressure (atmospheric pressure return).

(Boat Unloading and Wafer Discharging)

Thereafter, the seal cap 219 is moved down by the boat elevator 115 to open the lower end of the manifold 209. Then, the processed wafers 200 supported on the boat 217 are unloaded from the lower end of the manifold 209 to the outside of the reaction tube 203 (boat unloading). After the boat unloading, the shutter 219s is moved so that the lower end opening of the manifold 209 is sealed by the shutter 219s via the O-ring 220c (shutter closing). The processed wafers 200 are unloaded to the outside of the reaction tube 203 and are subsequently discharged from the boat 217 (wafer discharging).

(3) Effects According to the Present Embodiment

According to the present embodiment, one or more effects as set forth below may be achieved.

(a) By using the DS gas containing no C, N, Cl or the like as the precursor at step 2, it is possible to avoid mixing of an impurity such as C, N, Cl or the like into the second layer formed on the wafer 200. As a result, it is possible to allow the SiO film formed on the wafer 200 to become a film having a low concentration of impurity such as C, N, Cl or the like. By lowering the concentration of each of C and N in the SiO film, it is possible to allow this film to become a low-k film having a low dielectric constant (k value). Furthermore, by lowering the concentration of Cl in the SiO film, it is possible to allow this film to become a film having high wet etching resistance and ashing resistance, that is, a film having excellent processing resistance.

Furthermore, as the precursor, when an aminosilane-based gas such as a tris-dimethylaminosilane (Si[N(CH$_3$)$_2$]$_3$H, abbreviation: 3DMAS), a bis(diethylamino)silane (SiH$_2$[N(C$_2$H$_5$)$_2$]$_2$, abbreviation: BDEAS) or the like is used or when a halosilane-based gas such as a hexachloro-disilane (Si$_2$Cl$_6$, abbreviation: HCDS) gas or the like is used, the impurity such as C, N, Cl or the like may be likely to be mixed into the second layer formed on the wafer 200 to increase the dielectric constant of the SiO film formed on the wafer 200 or to reduce the processing resistance. A silicon hydride gas represented by a chemical formula Si$_n$H$_{2n+2}$ (where n is an integer of 1 or more) may be used as the precursor to lower the impurity concentration of the SiO film formed on the wafer 200.

(b) By supplying the O$_2$ gas having a relatively weak oxidizing power to the wafer 200 as the oxidizing agent under the condition in which atomic oxygen is not generated at step 3, it is possible to allow the oxidation reaction of the second layer to go ahead in an unsaturated reaction. As a result, it is possible to allow the SiO film formed on the wafer 200 to become a film having a non-stoichiometric composition, that is, a Si-rich SiO film. By setting the composition of the SiO film to such a Si-rich composition, it is possible to allow this film to become a film having excellent processing resistance.

Furthermore, when a gas having a relatively strong oxidizing power such as an O$_2$ gas+hydrogen (H$_2$) gas, an ozone (O$_3$) gas or the like is used as the oxidizing agent, even though these oxidizing agents are not plasma-excited, atomic oxygen is generated when supplying the oxidizing agents, and thus the oxidation reaction of the second layer is likely to be saturated, making it difficult to achieve the aforementioned effects. Moreover, even when an oxygen-containing substance obtained by plasma-exciting an O-containing gas such as an O$_2$ gas (by activating it with plasma) is used as the oxidizing agent, atomic oxygen is generated when supplying the oxidizing agent, and thus the oxidation reaction of the second layer is likely to be saturated, making it difficult to achieve the aforementioned effects. A gas not containing an oxygen-containing substance (for example, O$_2$*, O*, O, or O$_3$) obtained by plasma-exciting the O-containing gas may be used as the oxidizing agent to allow the SiO film formed on the wafer 200 to become a Si-rich SiO film.

(c) By setting the supply time of the O$_2$ gas at step 3 longer than the supply time of the DS gas at step 2, it is possible to avoid the composition of the SiO film formed on the wafer 200 from becoming excessively Si-rich. Furthermore, by setting the supply time of the O$_2$ gas at step 3 longer than the supply time of the BCl$_3$ gas at step 1 and by setting the supply time of the BCl$_3$ gas at step 1 longer than the supply time of the DS gas at step 2, it becomes possible to further avoid the composition of the SiO film formed on the wafer 200 from becoming excessively Si-rich. Further, by setting the supply time of the O$_2$ gas at step 3 to 10 times or more the supply time of the DS gas at step 2, it is possible to reliably avoid the composition of the SiO film formed on the wafer 200 from being excessively Si-rich. As a result, it is possible to avoid the deterioration of the insulation property of the SiO film formed on the wafer 200.

(d) By setting the internal pressure of the process chamber 201 at step 3 higher than the internal pressure of the process chamber 201 at step 2, it is possible to avoid the composition of the SiO film formed on the wafer 200 from becoming excessively Si rich. Furthermore, by setting the internal pressure of the process chamber 201 at step 3 higher than the internal pressure of the process chamber 201 at step 1 and by setting the internal pressure of the process chamber 201 at step 1 higher than the internal pressure of the process chamber 201 at step 2, it becomes possible to further avoid the composition of the SiO film formed on the wafer 200 from becoming excessively Si-rich. In addition, by setting the internal pressure of the process chamber 201 at step 3 to 14 times or more the internal pressure of the process chamber 201 at step 2, it is possible to reliably avoid the composition of the SiO film formed on the wafer 200 from becoming excessively Si-rich. As a result, it is possible to avoid the deterioration of the insulation property of the SiO film formed on the wafer 200.

(e) By performing step 1 of supplying the BCl$_3$ gas to the wafer 200 before performing step 2, and by adopting a condition in which the BCl$_3$ gas is adsorbed on the surface of the wafer 200 in the form of BCl$_x$ without being pyrolyzed at step 1 when the BCl$_3$ gas alone exists in the process chamber 201, it is possible to allow the SiO film formed on the wafer 200 to become a film having high in-plane film thickness uniformity and excellent step coverage characteristics. At all steps 1 to 3, when the $BCl_3$ gas alone exists in the process chamber 201, it is possible to more reliably achieve the aforementioned effects by adopting the condition in which the $BCl_3$ gas is adsorbed on the surface of the wafer 200 in the form of $BCl_x$ x without being pyrolyzed.

(f) By performing step 1 of supplying the $BCl_3$ gas to the wafer 200 before performing step 2, it is possible to allow the formation reaction of the second layer at step 2, that is, the formation reaction of the SiO film on the wafer 200, to go ahead at a practical rate. Furthermore, when a gas having a relatively weak oxidizing power such as an $O_2$ gas is used as the oxidizing agent, if step 1 is not performed, it may be difficult for the formation of the SiO film on the wafer 200 to go ahead at a practical rate. When an oxidizing agent having a relatively weak oxidizing power such as an $O_2$ gas is used, it becomes effective to utilize the catalytic action of the $BCl_3$ gas in order to allow the film-forming process to efficiently go ahead.

Furthermore, a case where an impurity such as B or the like is slightly mixed in the SiO film formed on the wafer 200 by performing step 1 may also be considered. However, even when B or the like is mixed in the SiO film, it was confirmed that the amount thereof is very small and thus the dielectric constant of the SiO film is not affected. In addition, although the processing resistance of the SiO film may be slightly affected by the mixing of B or the like in the SiO film, it was confirmed that even in that case, the effect of improving the processing resistance by enriching the SiO film with Si is even better, eliminating most of the influence.

(g) By performing step 1 of supplying the $BCl_3$ gas to the wafer 200 before performing step 2, it is possible to adopt a condition in which the film-forming reaction does not go ahead at step 2 when the DS gas alone exists in the process chamber 201. Thus, it is possible to appropriately suppress the pyrolysis of the DS gas in the process chamber 201, and to allow the SiO film formed on the wafer 200 to easily become a film having high in-plane film thickness uniformity and excellent step coverage.

(h) By performing the post-treatment step after performing the film-forming step, it is possible to desorb an impurity such as H or the like contained in the SiO film formed on the wafer 200 from the film. Furthermore, it is possible to densify the SiO film formed on the wafer 200. Thus, it is possible to further enhance the processing resistance of this film. Moreover, it is also possible to avoid an increase in the dielectric constant of the SiO film formed on the wafer 200 when the SiO film is exposed to the atmosphere.

(i) The effects mentioned above can be similarly achieved in the case where the aforementioned pseudo catalyst other than the $BCl_3$ gas is used, or in the case where the aforementioned silicon hydride gas other than the DS gas is used, or in the case where the aforementioned oxidizing agent other than the $O_2$ gas is used, or in the case where the aforementioned inert gas other than the $N_2$ gas is used.

Other Embodiments of the Present Disclosure

While the embodiments of the present disclosure has been specifically described above, the present disclosure is not limited to the aforementioned embodiments but may be variously modified without departing from the spirit of the present disclosure.

In the aforementioned embodiments, there has been described an example in which the heat treatment is performed on the SiO film formed on the wafer 200 at the post-treatment step. The present disclosure is not limited to the aforementioned embodiments, and for example, at the post-treatment step, the SiO film formed on the wafer 200 may be irradiated with $N_2$ plasma or the like, or may be irradiated with microwaves or the like. Even in these cases, the same effects as those in the case of performing the heat treatment at the post-treatment step may be achieved. Furthermore, in the case of performing a plasma irradiation process or a microwave irradiation process, the processing temperature may be lowered and the thermal history of the wafer 200 may be reduced, compared with the case of performing the heat treatment. For example, in the case of performing the plasma irradiation process or the microwave irradiation process, the processing temperature may be set at a room temperature (25 degrees C.) or higher and 470 degrees C. or lower, and may be set at a room temperature or higher and 450 degrees C. or lower. That is, the processing temperature of the post-treatment step may be set similar to the processing temperature of the film-forming step.

Recipes used in the substrate processing may be provided individually according to the processing contents and may be stored in the memory device 121*c* via a telecommunication line or the external memory device 123. Moreover, at the start of the substrate processing, the CPU 121*a* may properly select an appropriate recipe from the recipes stored in the memory device 121*c* according to the processing contents. Thus, it is possible for a single substrate processing apparatus to form films of different kinds, composition ratios, qualities and thicknesses with enhanced reproducibility. In addition, it is possible to reduce an operator's burden and to quickly start the substrate processing while avoiding an operation error.

The recipes mentioned above are not limited to newly-provided ones but may be provided by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiments, there has been described an example in which films are formed by using a batch-type substrate processing apparatus capable of processing a plurality of substrates at a time. The present disclosure is not limited to the aforementioned embodiments but may be appropriately applied to, for example, a case where films are formed by using a single-wafer-type substrate processing apparatus capable of processing a single substrate or several substrates at a time. In addition, in the aforementioned embodiments, there has been described an example in which films are formed by using the substrate processing apparatus provided with a hot-wall-type process furnace. The present disclosure is not limited to the aforementioned embodiments but may be appropriately applied to a case where films are formed by using a substrate processing apparatus provided with a cold-wall-type process furnace.

In the case of using these substrate processing apparatuses, the film-forming process may be performed by the processing procedures and processing conditions similar to those of the aforementioned embodiments. Effects similar to those of the aforementioned embodiments may be achieved.

The embodiments described above may be appropriately combined with one another. The processing procedures and processing conditions at this time may be similar to, for example, the processing procedures and processing conditions of the aforementioned embodiments.

Example

In an example, a SiO film was formed on a wafer by using the substrate processing apparatus illustrated in FIG. 1 and by the film-forming sequence illustrated in FIG. 4. At this time, the supply time of an $O_2$ gas at step 3 (hereinafter, simply referred to as an $O_2$ gas supply time) was set to 15 seconds, 30 seconds, 45 seconds, 80 seconds, and 180 seconds, and samples of the SiO film formed in each case were produced. The processing conditions other than the $O_2$ gas supply time when producing each of these samples of the SiO film were set similar to conditions which fall within the processing condition range described in the aforementioned embodiments.

Figure 5A:
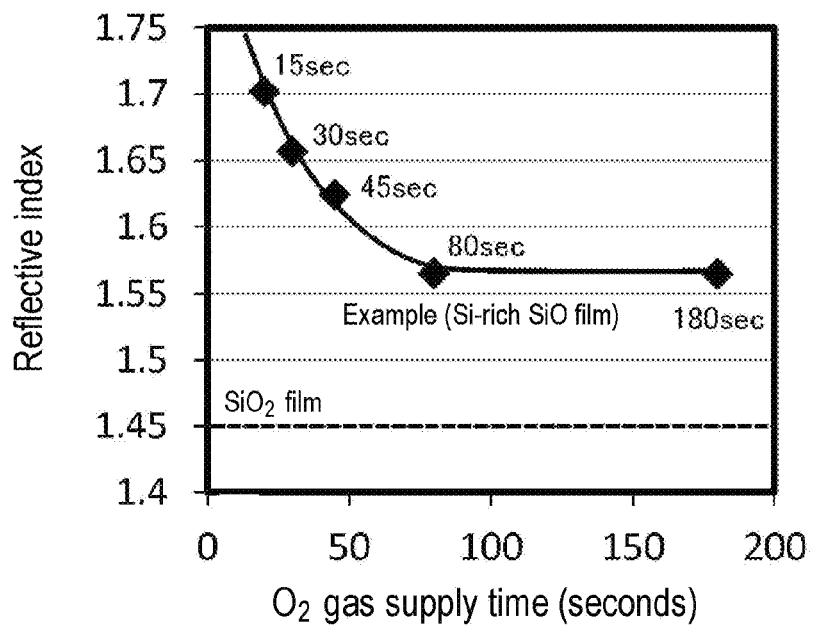
FIG. 5A is a diagram illustrating dependency of a refractive index of a SiO film on an $O_2$ gas supply time.

Then, a refractive index of each of the samples of the SiO film in the example was measured. The measurement result is shown in FIG. 5A. In FIG. 5A, the horizontal axis indicates an $O_2$ gas supply time (seconds) and the vertical axis indicates a refractive index. A solid line in FIG. 5A indicates a refractive index of each of the samples of the SiO film in the example. A broken line in FIG. 5A indicates a refractive index (1.45) of a $SiO_2$ film having a stoichiometric composition (hereinafter, simply referred to as a $SiO_2$ film) for reference.

According to FIG. 5A, it can be seen that the refractive index of each of samples of the SiO film in the example is larger than the refractive index of the $SiO_2$ film. It is considered that this is because each of the samples of the SiO film in the example is a Si-rich SiO film having a non-stoichiometric composition. Furthermore, it can be seen that the refractive index of each sample of the SiO film in the example is lowered as the $O_2$ gas supply time becomes longer within a range in which the $O_2$ gas supply time is within 80 seconds, and is difficult to be lowered when the $O_2$ gas supply time exceeds 80 seconds. That is, when the $O_2$ gas supply time is set at a time which falls within a predetermined time (for example, 80 seconds), it can be seen that the refractive index of the SiO film, that is, the composition of the SiO film, can be controlled by changing the $O_2$ gas supply time within that range. Moreover, when the $O_2$ gas supply time exceeds the predetermined time described above, it can be seen that the oxidation reaction of the second layer which goes ahead at step 3 is likely to be saturated, and the SiO film formed on the wafer becomes easier to remain in a Si-rich composition state.

Figure 5B:
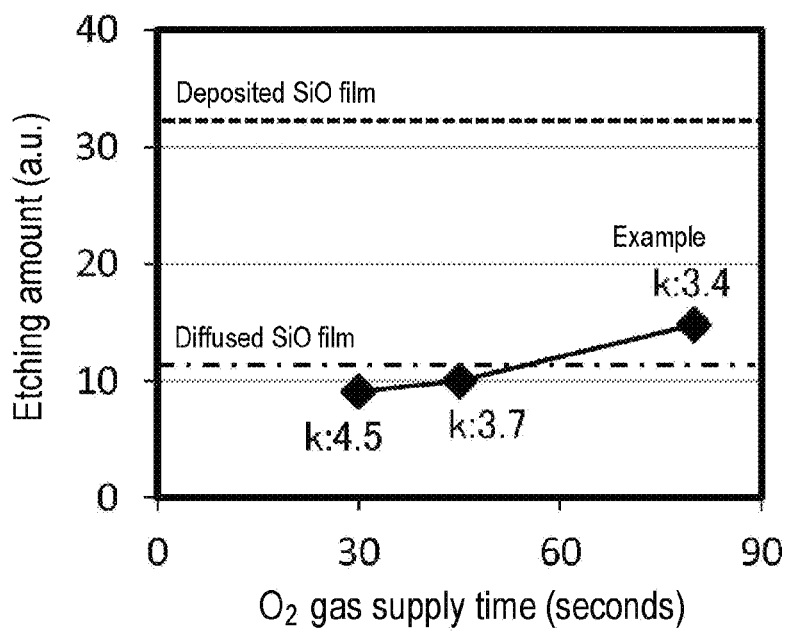
FIG. 5B is a diagram illustrating dependency of an etching amount of the SiO film by wet etching on the $O_2$ gas supply time, and a dielectric constant.

Next, wet etching resistance of each sample of the SiO film in the example was evaluated. The measurement result is shown in FIG. 5B. In FIG. 5B, the horizontal axis indicates an $O_2$ gas supply time (seconds), and the vertical axis indicates an etching amount of each sample of the SiO film (hereinafter, simply referred to as an etching amount) when each sample of the SiO film is immersed for 10 seconds in a hydrogen fluoride (HF) aqueous solution having a concentration of 1%. A solid line in FIG. 5B indicates an etching amount of each sample of the SiO film in the example formed by setting the $O_2$ gas supply time to 30 seconds, 45 seconds, and 80 seconds. A broken line in FIG. 5B indicates an etching amount of the SiO film formed on the wafer (hereinafter, referred to as a deposited SiO film) by alternately and repeatedly supplying a hexachlorodisilane ($Si_2Cl_6$, abbreviation: HCDS) gas and an $O_2$ gas+$H_2$ gas to the wafer for reference. An alternate long and short dash line in FIG. 5B indicates an etching amount of a SiO film formed by supplying an oxidizing agent to a heated wafer to thermally oxidize a surface of the wafer (hereinafter, referred to as a diffused SiO film) for reference.

According to FIG. 5B, it can be seen that the etching amounts of the samples of the SiO film in the example are all smaller than the etching amount of the deposited SiO film. That is, it can be seen that all the samples of the SiO film in the example have higher etching resistance than the deposited SiO film. Furthermore, it can be seen that the etching amount of each sample of the SiO film in the example becomes smaller than the etching amount of the diffused SiO film in the sample when the $O_2$ gas supply time is set to 30 seconds and 45 seconds. That is, it can be seen that, among the samples of the SiO film in the example, samples whose $O_2$ gas supply times are set to 30 seconds and 45 seconds have higher etching resistance than the diffusion SiO film. That is, it is understood that it is possible to allow the SiO film to become a film having higher etching resistance than the diffusion SiO film by adjusting the $O_2$ gas supply time when forming the SiO film.

Next, a dielectric constant of each sample of the SiO film in the example was measured. The measurement result is shown in FIG. 5B. As shown in FIG. 5B, the dielectric constant (k value) of each sample of the SiO film in the example formed by setting the $O_2$ gas supply time to 30 seconds, 45 seconds, and 80 seconds was sequentially 4.5, 3.7 and 3.4. That is, it can be seen that, among the samples of the SiO film in the example, samples whose $O_2$ gas supply times are set to 45 seconds and 80 seconds have a lower dielectric constant than the $SiO_2$ film. From this, it is understood that it is possible to control the dielectric constant of the SiO film by adjusting the $O_2$ gas supply time when forming the SiO film, and to allow the SiO film to become a low-k film having a low dielectric constant.

Next, an insulation property of each sample of the SiO film in the example was evaluated. The measurement result is shown in FIG. 6A. In FIG. 6A, the vertical axis indicates a current density (A/cm$^2$) of current flowing through the film, and the horizontal axis indicates a strength (MV/cm) of an electric field applied to the film. A solid line, a broken line, and an alternate long and short dash line in FIG. 6A respectively show measurement results of each sample of the SiO film in the example formed by sequentially setting the $O_2$ gas supply time to 30 seconds, 45 seconds, and 80 seconds. According to FIG. 6A, it can be seen that the density of the current flowing through the SiO film formed by setting the $O_2$ gas supply time longer is lower than that of the SiO film formed by setting the $O_2$ gas supply time shorter. That is, it is understood that the insulation property of the SiO film formed on the wafer increases, as the $O_2$ gas supply time when forming the SiO film increases.

Figure 6B:
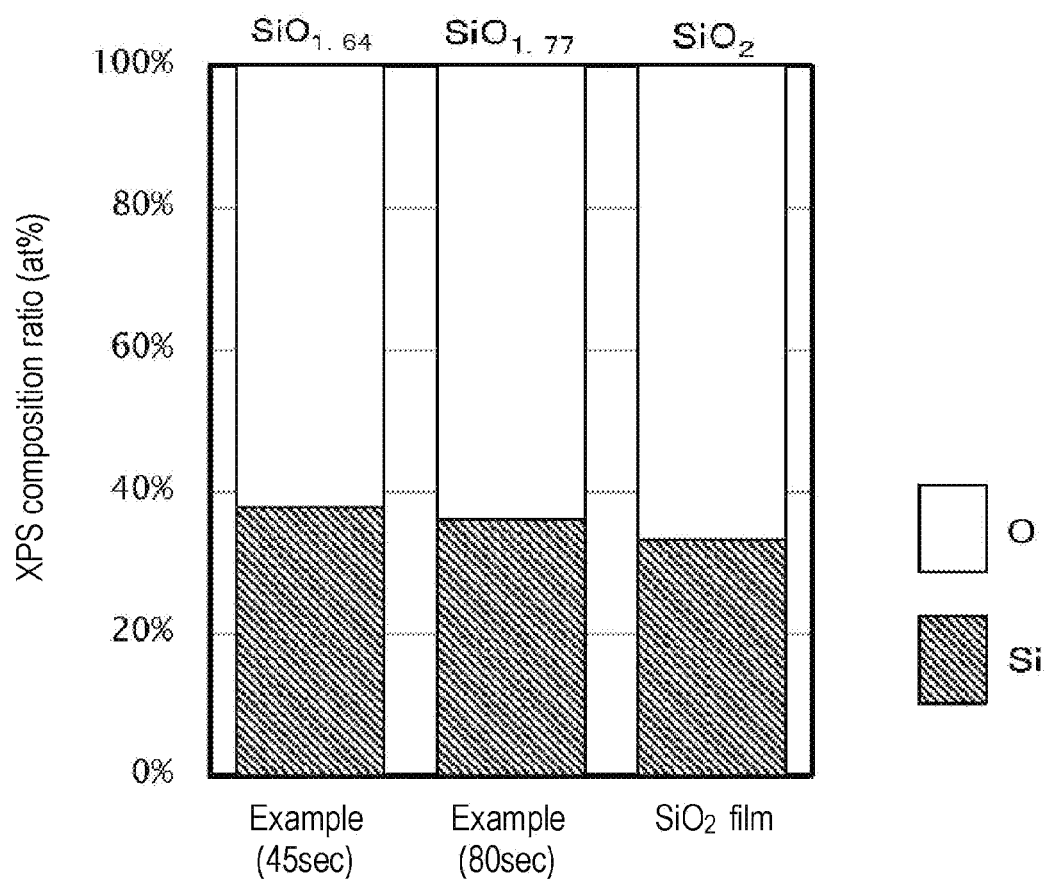
FIG. 6B is a diagram illustrating a composition of the SiO film.

Next, a composition of each sample of the SiO film in the example was evaluated. The measurement result is shown in FIG. 6B. In FIG. 6B, the vertical axis indicates concentrations (at %) of Si and O in the SiO film measured by X-ray photoelectron spectroscopy (XPS). In FIG. 6B, the horizontal axis sequentially indicates each sample of the SiO film and the $SiO_2$ film in the example formed by setting the $O_2$ gas supply time to 45 seconds and 80 seconds. As shown in FIG. 6B, it can be seen that the Si concentration in the sample of the SiO film in the example when the $O_2$ gas supply time was set to 45 seconds was 37.9 at %, and this film is formed of a substance represented by $SiO_{1.64}$. Furthermore, it can be seen that the Si concentration in the sample of the SiO film in the example when the $O_2$ gas supply time was set to 80 seconds was 36.1 at %, and this film is formed of a substance represented by $SiO_{1.77}$. That is, it can be seen that any of the SiO films has a Si-rich composition represented by SiO$_x$ (where 1.5≤x≤1.9). It is also understood that the composition of the SiO film may be closer to a Si-rich direction, as the O$_2$ gas supply time when forming the SiO film becomes shorter.

According to the present disclosure in some embodiments, it is possible to improve a film quality of a silicon oxide film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
    forming a silicon oxide film having a non-stoichiometric composition on the substrate by repeating a cycle a plurality of times, the cycle including non-simultaneously performing:
    (a) adsorbing a pseudo catalyst on a surface of the substrate by supplying the pseudo catalyst to the substrate;
    (b) adsorbing silicon contained in a silicon hydride on the surface of the substrate by action of the pseudo catalyst adsorbed on the surface of the substrate by supplying the silicon hydride to the substrate; and
    (c) oxidizing the silicon adsorbed on the surface of the substrate by supplying an oxidizing agent to the substrate under a condition in which atomic oxygen is not generated,
    wherein a ratio of the number of silicon atoms to the number of oxygen atoms in the silicon oxide film having the non-stoichiometric composition is larger than a ratio of the number of silicon atoms to the number of oxygen atoms in a silicon oxide film having a stoichiometric composition.

2. The method according to claim 1, wherein the silicon oxide film having the non-stoichiometric composition is made of a substance represented by a chemical formula SiO$_x$ (where 1.5≤x≤1.9).

3. The method according to claim 1, wherein the silicon oxide film having the non-stoichiometric composition is made of a substance represented by a chemical formula SiO$_x$ (where 1.6≤x≤1.8).

4. The method according to claim 1, wherein (a), (b), and (c) are performed under a condition in which the pseudo catalyst is not gas-phase decomposed.

5. The method according to claim 1, wherein the pseudo catalyst contains halogen, and the surface of the substrate is terminated with the halogen in (a).

6. The method according to claim 1, wherein the pseudo catalyst is boron halide.

7. The method according to claim 1, wherein the cycle further includes removing the pseudo catalyst floating in a space in which the substrate is located after performing (a) and before performing (b).

8. The method according to claim 1, wherein (b) is performed in a state in which the pseudo catalyst is adsorbed on the surface of the substrate and the pseudo catalyst is not floating in a space in which the substrate is located.

9. The method according to claim 1, wherein in (a), silicon contained in an intermediate generated by decomposing the silicon hydride is adsorbed on the surface of the substrate by the action of the pseudo catalyst adsorbed on the surface of the substrate.

10. The method according to claim 1, wherein the silicon hydride is a compound represented by a chemical formula Si$_n$H$_{2n+2}$ (where n is an integer of 1 or more).

11. The method according to claim 1, wherein the silicon hydride is at least one of SiH$_4$ and Si$_2$H$_6$.

12. The method according to claim 1, wherein the oxidizing agent contains no oxygen-containing substance obtained by activating an oxygen-containing gas with plasma.

13. The method according to claim 1, wherein the oxidizing agent is O$_2$.

14. The method according to claim 1, wherein a supply time of the oxidizing agent in (c) is set longer than a supply time of the silicon hydride in (b).

15. The method according to claim 1, wherein a supply time of the oxidizing agent in (c) is set longer than a supply time of the pseudo catalyst in (a), and the supply time of the pseudo catalyst in (a) is set longer than a supply time of the silicon hydride in (b).

16. The method according to claim 1, wherein a pressure of a space in which the substrate is located in (c) is set higher than a pressure of the space in which the substrate is located in (b).

17. The method according to claim 1, wherein a pressure of a space in which the substrate is located in (c) is set higher than a pressure of the space in which the substrate is located in (a), and the pressure of the space in which the substrate is located in (a) is set higher than a pressure of the space in which the substrate is located in (b).

18. A method of manufacturing a semiconductor device comprising:
    processing the substrate according to the method according to claim 1.

* * * * *